(12) United States Patent
Sengodan et al.

(10) Patent No.: US 10,778,162 B1
(45) Date of Patent: Sep. 15, 2020

(54) SENSING ANALOG SIGNAL THROUGH DIGITAL I/O PINS

(71) Applicant: Rosemount Aerospace Inc., Burnsville, MN (US)

(72) Inventors: Rajkumar Sengodan, Tamilnadu (IN); Saravanan Munusamy, Tamilnadu (IN)

(73) Assignee: ROSEMOUNT AEROSPACE, INC., Burnsville, MN (US)

( * ) Notice: Subject to any disclaimer, the term of this patent is extended or adjusted under 35 U.S.C. 154(b) by 0 days.

(21) Appl. No.: 16/542,664

(22) Filed: Aug. 16, 2019

(30) Foreign Application Priority Data

Jun. 21, 2019 (IN) .............................. 201911024674

(51) Int. Cl.
*H03F 3/45* (2006.01)
*H03M 1/06* (2006.01)
*H03M 1/12* (2006.01)

(52) U.S. Cl.
CPC ............ *H03F 3/45* (2013.01); *H03M 1/0619* (2013.01); *H03M 1/12* (2013.01)

(58) Field of Classification Search
CPC .......... H03F 3/45; H03M 1/12; H03M 1/0619
USPC .................................................. 341/155, 118
See application file for complete search history.

(56) References Cited

U.S. PATENT DOCUMENTS

| | | | | |
|---|---|---|---|---|
| 5,724,009 A | * | 3/1998 | Collins | ................... H03L 1/026 326/38 |
| 7,235,999 B2 | | 6/2007 | Goetting et al. | |
| 7,369,078 B2 | * | 5/2008 | Nickel | ...................... G06F 3/05 341/100 |
| 7,411,538 B1 | * | 8/2008 | Piasecki | ............. H03M 1/0607 341/155 |
| 2003/0188202 A1 | | 10/2003 | D'Angelo et al. | |

FOREIGN PATENT DOCUMENTS

IN 20130065614 A1 10/2014
JP 5534584 A 3/1980

OTHER PUBLICATIONS

Executed European Search Report for EP Application No. 19212838.7 dated Jul. 1, 2020, pp. 1-9.
Kester et al., "ADC Architectures VII: Counting ADCs" Analog Devices, Tutorial, Oct. 31, 2008, pp. 1-5.

* cited by examiner

*Primary Examiner* — Brian K Young
(74) *Attorney, Agent, or Firm* — Cantor Colburn LLP

(57) ABSTRACT

Systems and methods for sensing an analog signal through digital input/output (I/O) pins are provided. Aspects include an analog to digital (ADC) circuit configured to generate a digital signal based on observations of the analog signal obtained from an analog circuit, where the ADC circuit includes a difference amplifier, a comparator, a divideby2 counter and two AND gates. Aspects also include a controller including a pin configured to receive the digital signal. The controller is configured to count pulses within the digital signal and determine values corresponding to the analog signal based on the counted pulses.

20 Claims, 7 Drawing Sheets

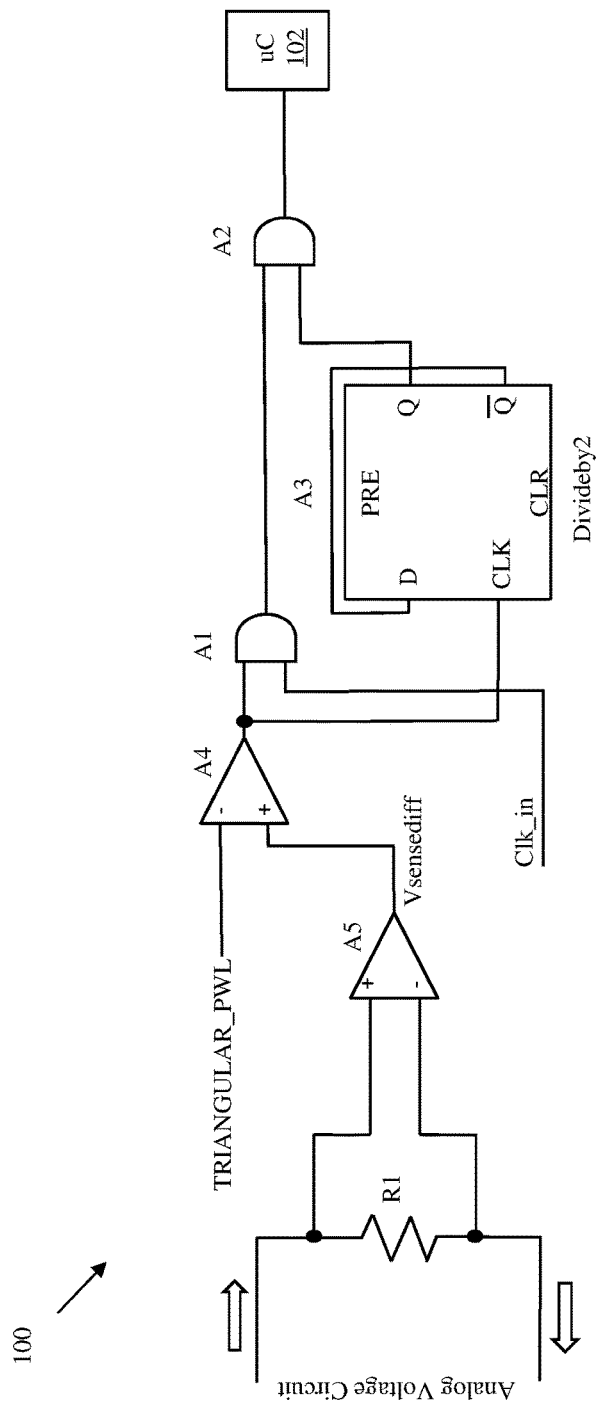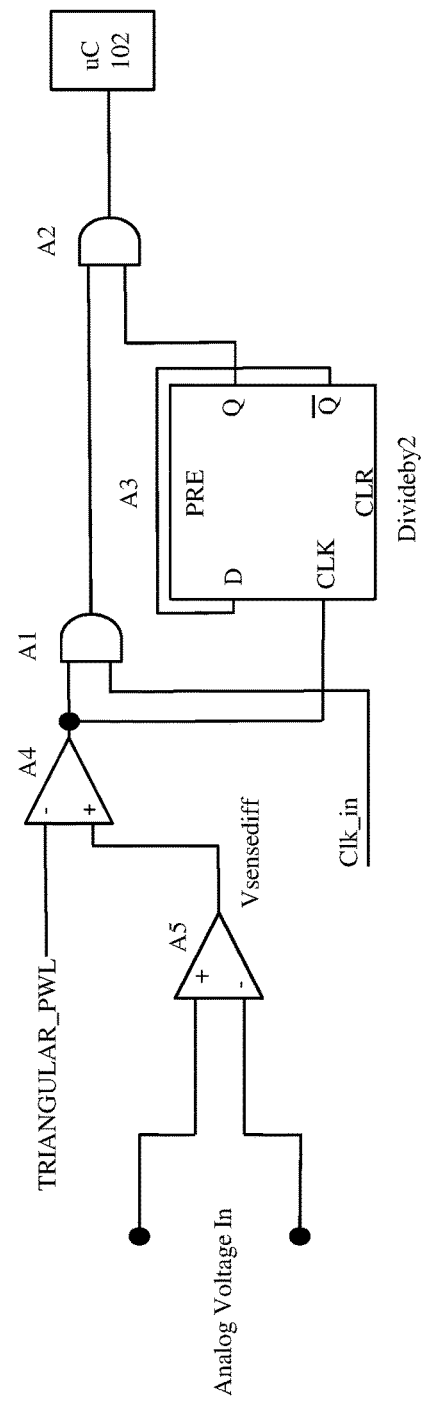
FIG. 1A
FIG. 1B

SENSING ANALOG SIGNAL THROUGH DIGITAL I/O PINS

FOREIGN PRIORITY

This application claims priority to Indian Patent Application No. 201911024674, filed Jun. 21, 2019, and all the benefits accruing therefrom under 35 U.S.C. § 119, the contents of which in its entirety are herein incorporated by reference.

BACKGROUND

The present invention generally relates to circuits, and more specifically, to system and method for sensing an analog signal through digital input/output (I/O) pins of a device such as a controller.

An analog to digital converter (ADC) is a system that converts an analog signal into a digital signal. For example, an ADC may convert an analog voltage or current to a digital number representing the magnitude of the voltage or current. Conventional ADCs include a difference amplifier module that computes the voltage difference generated across pins connected to an analog circuit and a current determination unit that computes the equivalent current. Conventional methods involve inclusion on an ADC block within a controller in order to obtain digital data such that each controller within a design may have its own ADC block.

SUMMARY

Embodiments of the present invention are directed to a system for sensing an analog signal through digital input/output (I/O) pins. A non-limiting example of the system includes an analog to digital conversion (ADC) circuit configured to generate a digital signal based on observations of the analog signal obtained from an analog circuit. The ADC circuit includes a difference amplifier, a comparator, a divideby2 counter, a first AND gate and a second AND gate. The system also includes a controller including a pin configured to receive the digital signal. The controller is configured to count pulses within the digital signal and determine values corresponding to the analog signal based on the counted pulses.

Embodiments of the present invention are directed to a method for sensing an analog signal through digital input/output (I/O) pins. A non-limiting example of the method includes converting, via an analog to digital conversion (ADC) circuit, the analog signal into a digital signal. The method includes receiving the digital signal via a pin of a controller. The method includes counting, by the controller, pulses within the digital signal. The method also includes determining, by the controller, values corresponding to the analog signal based on the counted pulses.

Additional technical features and benefits are realized through the techniques of the present invention. Embodiments and aspects of the invention are described in detail herein and are considered a part of the claimed subject matter. For a better understanding, refer to the detailed description and to the drawings.

BRIEF DESCRIPTION OF THE DRAWINGS

The specifics of the exclusive rights described herein are particularly pointed out and distinctly claimed in the claims at the conclusion of the specification. The foregoing and other features and advantages of the embodiments of the invention are apparent from the following detailed description taken in conjunction with the accompanying drawings in which:

FIG. 1A depicts a block diagram of a circuit topology for sensing an analog signal through digital input/output (I/O) pins of a controller according to one or more embodiments;

FIG. 1B depicts another block diagram of a circuit topology for sensing an analog signal through digital input/output (I/O) pins of a controller according to one or more embodiments;

Figure 2:
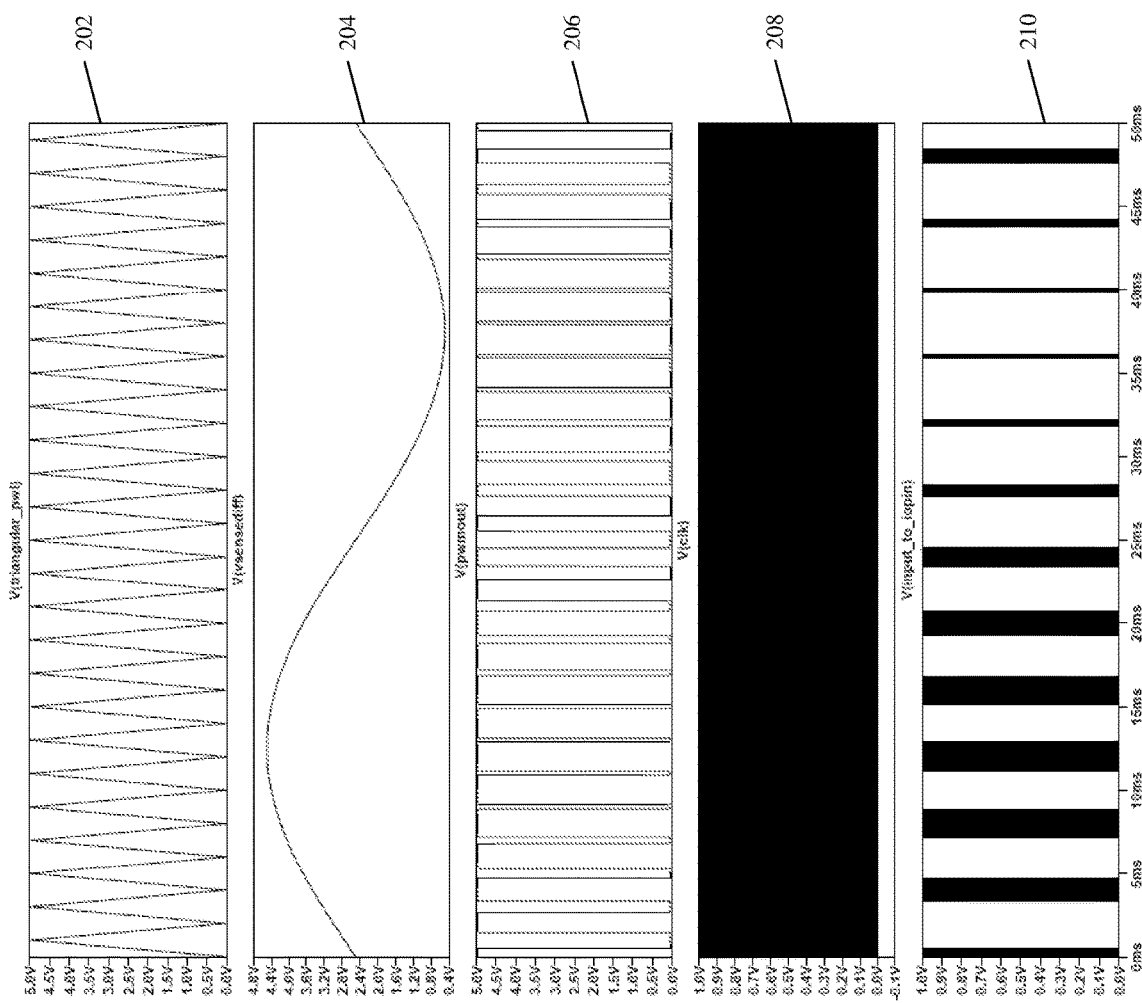
FIG. 2 depicts example waveforms captured at different nodes of a circuit for sensing an analog signal through digital I/O pins of a controller according to one or more embodiments.

The diagrams depicted herein are illustrative. There can be many variations to the diagram or the operations described therein without departing from the spirit of the invention. For instance, the actions can be performed in a differing order or actions can be added, deleted or modified. Also, the term "coupled" and variations thereof describes having a communications path between two elements and does not imply a direct connection between the elements with no intervening elements/connections between them. All of these variations are considered a part of the specification.

DETAILED DESCRIPTION

Various embodiments of the invention are described herein with reference to the related drawings. Alternative embodiments of the invention can be devised without departing from the scope of this invention. Various connections and positional relationships (e.g., over, below, adjacent, etc.) are set forth between elements in the following description and in the drawings. These connections and/or positional relationships, unless specified otherwise, can be direct or indirect, and the present invention is not intended to be limiting in this respect. Accordingly, a coupling of entities can refer to either a direct or an indirect coupling, and a positional relationship between entities can be a direct or indirect positional relationship. Moreover, the various tasks and process steps described herein can be incorporated into a more comprehensive procedure or process having additional steps or functionality not described in detail herein.

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

The terms "at least one" and "one or more" may be understood to include any integer number greater than or equal to one, i.e. one, two, three, four, etc. The terms "a plurality" may be understood to include any integer number greater than or equal to two, i.e. two, three, four, five, etc. The term "connection" may include both an indirect "connection" and a direct "connection."

For the sake of brevity, conventional techniques related to making and using aspects of the invention may or may not be described in detail herein. In particular, various aspects of computing systems and specific computer programs to implement the various technical features described herein are well known. Accordingly, in the interest of brevity, many conventional implementation details are only mentioned briefly herein or are omitted entirely without providing the well-known system and/or process details.

Turning now to an overview of technologies that are more specifically relevant to aspects of the invention, an ADC is conventionally included within a controller or field programmable gate array (FPGA) to allow the controller/FPGA to convert sampled analog signals to digital signals. As will be appreciated by those of skill in the art, such analog to digital signal conversion has many applications, including for example, converting sound or light signals to digital sounds and images, as well as enabling digital read outs of measured analog voltages and/or currents within a circuit. Large/complex devices such as aircraft systems, automobiles and consumer electronics may include a large number of controllers/FPGAs having ADCs which can represent a large overhead in terms of the amount of integrated circuit (IC) space devoted to implementing ADC blocks. Further, because each controller/FPGA conventionally includes its own ADC, the need for ADC ICs can constrain the design of a device or circuit. One or more embodiments disclosed herein may reduce the amount of ADC utilization in FPGAs and controllers to reduce the amount of design overhead. A reduction in the number of ADCs can also result in an additional benefit of significant power savings within a design due to reduced ADC utilization.

In one or more embodiments, a digital I/O pin analog signal sensing architecture is provided that can yield analog to digital conversion more efficiently than conventional methods. Embodiments of the digital I/O pin analog signal sensing architecture described herein can be configured in voltage or current sense applications in a manner that reduces the amount of circuit resources that are utilized. Embodiments of the digital I/O pin analog signal sensing architecture described herein may reduce the large overhead of ADC ICs necessary in both alternating current (AC) and direct current (DC) applications to convert analog signals to digital signals by providing circuitry that outputs a digital signal that can be used to reconstruct analog values of the sensed analog signal to one or more pins of a controller or FGPA, thereby eliminating the needs for each controller/FGPA to implement its own ADC block.

In addition to eliminating the need for distinct ADC ICs to sample the analog signal, the circuits and techniques disclosed herein provide other advantages over conventional techniques. For example, in accordance with some embodiments, an FPGA can be utilized directly in conjunction with one or more of the circuits described herein, reducing the need and space for ADC ICs. The circuits and techniques described herein allow for sampling time and resolution optimization. In conventional systems, the controllers are limited to the number of ADCs, meaning that if more signals need to be digitized, then the system will require more and more ADCs. By contrast, the disclosed circuits and techniques avoid this problem by utilizing digital IO pins to sample the analog signals.

FIG. 1A depicts a block diagram of a circuit topology 100 for sensing an analog signal through digital input/output (I/O) pins of a controller according to one or more embodiments. The circuit topology 100 is utilized for outputting, based on a sensed analog signal from an analog voltage circuit, a digital signal to a pin of a controller 102. Controller 102 can include a microcontroller, an FGPA, a digital signal processor (DSP), or another other type of controller that may conventionally include an ADC block. As shown in FIG. 1A, in some embodiments, a digital I/O pin analog signal sensing architecture can include a difference amplifier A5, a comparator A4, a divideby2 counter A3, and two AND gates A1, A2. As will be appreciated by those of skill in the art, the divideby2 counter A3 may be implemented using a D-latch or D-flipflop. According to some embodiments in which controller 102 is an FPGA, one or more elements of circuit topology 100 may be programmed in to the FPGA itself to save space and cost. For example, in some embodiments, AND gates A1, A2 and divideby2 counter A3 can be programmed in to an FPGA.

According to some embodiments the inputs of the difference amplifier A5 may be connected to an analog voltage circuit at a location where measurements are desired to be obtained. For example, as shown in FIG. 1A, the inputs of the difference amplifier A5 may be connected to either side of a resister R1 of the analog voltage circuit. Alternatively, in some embodiments, the difference amplifier A5 may be connected to any source of analog input voltage, as shown in FIG. 1B. As will be understood by those of skill in the art, the difference amplifier may output a difference signal Vsensediff that represents the voltage difference between the two signals input into the difference amplifier A5. According to some embodiments, the difference amplifier A5 may amplify the difference between the input voltages to generate the output signal Vsensediff. For example, in some embodiments, the difference amplifier A5 may amplify and/or attenuate the signal in order to match an input level of comparator A4. According to some embodiments, the difference signal Vsensediff may be received by the non-inverting input of the comparator A4, while the inverting input of the comparator A4 may receive a triangular (or sawtooth) wave (shown as "Triangular_PWL" in FIGS. 1A and 1B). FIG. 2 shows an example triangular wave 202 (which may also be referred to as a triangular wave signal) and difference signal 204 that may be received as inputs to comparator A4. As will be understood by those of skill in the art, the triangular wave provided as an inverting input to comparator A4 can be provided by an external source.

The triangular wave provided to the comparator A4 acts to generate pulse width modulation (PWM) for the analog voltage senses at the resistor R1 (i.e., Vsensediff). The comparator A4 outputs a PWM signal based on the input variation. FIG. 2 illustrates an example PWM signal Vpmwout 206 that may be output by the comparator A4 based on the received triangular wave and difference signal.

As shown in FIG. 1A, the output of the comparator A4 can be provided as a clock signal input to the Divideby2 counter A3 and as an input to AND gate A1. AND gate A1 may also receive a high frequency clock pulse signal Clk_in as an additional input. FIG. 2 shows an example high frequency clock signal 208. As shown, the frequency of a high frequency clock signal 208 may be so high that its periodicity may be visually imperceptible at the resolution shown in FIG. 2, causing the signal 208 to appear as though it is a solid bar in the chart. According to some embodiments, the high frequency clock signal Clk_in can be provided from an existing square wave oscillator utilized for microcontroller operation or through an external reference that is required for counting purposes during a software routine. The AND gate A1 outputs a signal that is the superposition of the Clk_in signal on the PWM pulse signal generated by the comparator A4. The output of AND gate A1 and a square wave output at the Q pin of the divideby2 counter may be input into AND gate A2. It will be understood that the divideby2 counter A3 is configured to provide frequency division needed for controller logic implementation. The AND gate A2 outputs a resultant digital signal that includes bursts of pulses (which may also be referred to as groups of continuous pulses) to a digital I/O pin of the controller 102, which the controller may then convert to digital values based on the number of continuous pulses in each group/burst of pulses. The number of pulses in a burst represents the digital value of the input signal across R1. An example of the output signal of AND gate A2 is shown in FIG. 2 as V(input_to_IOpin) signal 210. Although it is imperceptible in FIG. 2 due to the resolution, it will be understood that frequency of the V(input_to_IOpin) signal is the same as that of the clock signal V(clk). As can be seen in FIG. 2, the V(input_to_IOpin) signal provides a digital signal that represents the magnitude of the sensed analog signal by length of the pulse count. Thus, for example, at around 25 ms the V(input_to_IOpin) signal 210 shows a digital signal with a large pulse count (i.e., a bar a with thick width), which corresponds to an approximate maximum voltage in the difference signal Vsensediff 204 (i.e., the sensed analog signal), whereas at around 72 ms the V(input_to_IOpin) signal 210 shows a digital signal with a small pulse count (i.e., a bar with a thin width), which corresponds to an approximate minimum voltage in the sensed analog signal 204. Thus, as illustrated by FIG. 2, the circuit of FIGS. 1A or 1B can generate a digital signal for input to a pin of a controller 102 that represents the sensed analog signal, based on the circuit elements provided and the use of a triangular wave and a high frequency clock signal. The controller 102 can convert the signal to values representative of the time-varying magnitude of the analog signal based on a count of the number of continuous pulses in each sample.

Based on the example the digital I/O pin analog signal sensing architecture shown in FIGS. 1A and 1B and described above, it will be understood that the frequency of the high frequency clock signal Clk_in controls the resolution of the sampled signal, such that that resolution may be increased by increasing the frequency of the high frequency clock signal Clk_in. Further, the triangular wave will provide the sampling interval for the input signal. As such, the wave period of the triangular wave may be set based on a desired sampling interval selected by a user. Thus, in some embodiments, if frequent sampling is not needed and the sensed input signal varies slowly, it may be desirable to set the frequency of the triangular wave to be relatively lower than it would be in other situations. Because the sampling interval and the resolution of the sampling interval may be modified based on modifications to the triangular wave and high frequency clock signal (clk_in) respectively, the circuits and techniques described herein may allow for the sampling interval and resolution to be varied with respect to the application to be used.

In some embodiments, controller 102 may count the number of pulses present in the signal input to the controller 102 for each sampling interval for use in reconstructing an approximation of the sensed analog signal. According to some embodiments, the divideby2 counter A3 shown in FIGS. 1A and 1B can be implemented allow a software routine of the controller 102 to distinguish the next interval of sampled data. According to some embodiments, the software routine of the controller 102 can be written in such a way that an internal counter of the controller 102 will count each pulse included in one period duration of the triangular wave pulse and then wait for a one period duration of the triangular wave pulse before performing a subsequent count of pulses in the next period. According to some embodiments, if the controller 102 does not detect an event for a one period interval of the triangular wave, then the software routine can exit from the counting loop.

Figure 3:
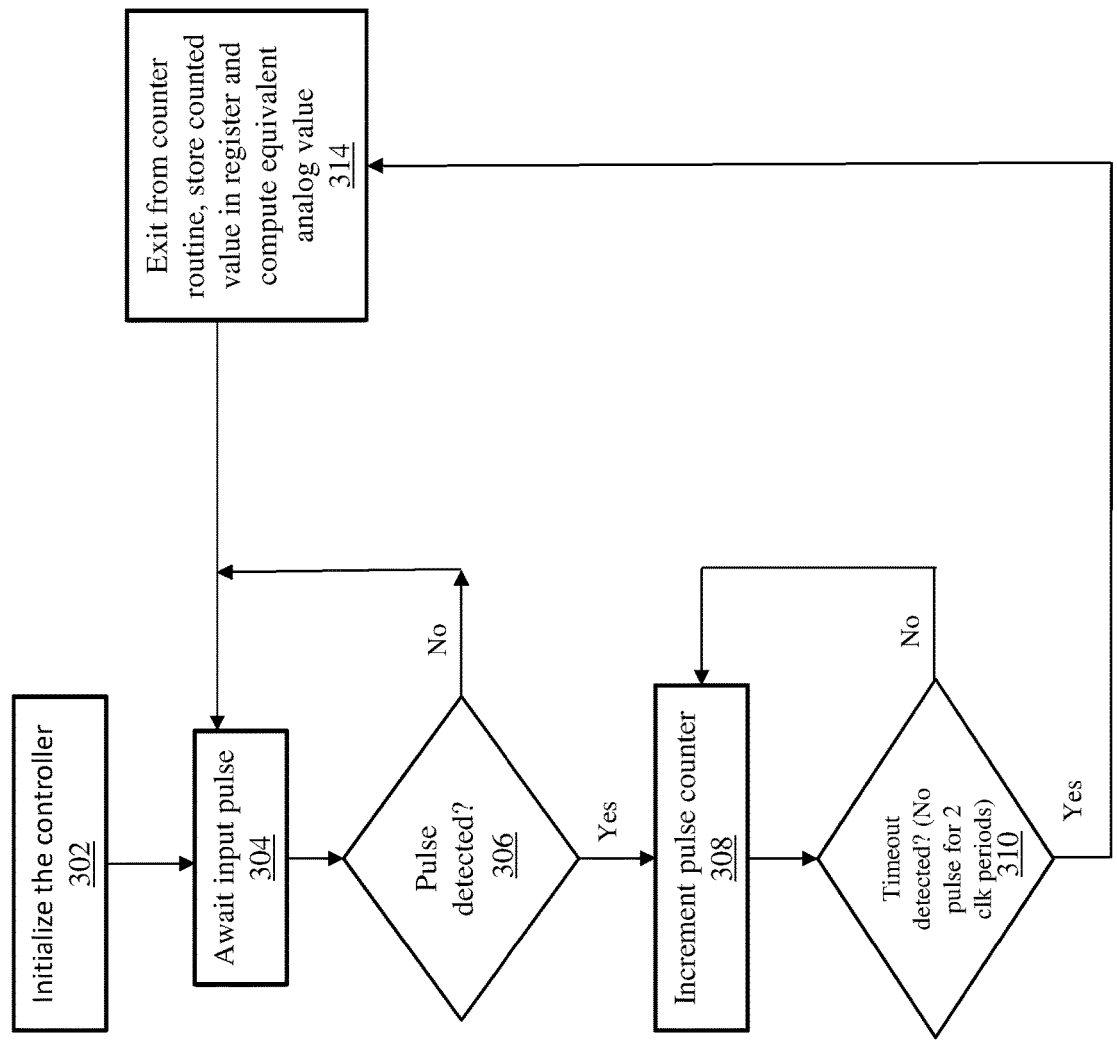
FIG. 3 depicts a flow diagram of a method for providing for the determination of analog values corresponding to a sensed analog signal based on a signal generated by a digital I/O pin analog signal sensing architecture according to one or more embodiments.

FIG. 3 depicts a flow diagram of a method 300 for providing for the determination of analog values corresponding to a sensed analog signal based on a signal generated by a digital I/O pin analog signal sensing architecture according to one or more embodiments. The method 300 includes initializing the controller 102, as shown in block 302. According to some embodiments, the controller is initialized with a set of parameters to allow it to properly execute a pulse counting routine. The parameters can include the triangular wave pulse period, the high frequency clock (clk_in) period, the series resistor (R1) value and the high frequency clock (clk_in) pulse resolution per mV. At block 304, the method 300 includes awaiting, by the controller 102, an input pulse. An input pulse is a burst of pulses at a voltage level that is acceptable by the controller 102 (e.g., typically 3.3V or 5V). Each burst includes a number of pulses (at the frequency of Clk_in) that is proportional to the input voltage across R1. At block 306, the method includes, determining, by the controller, whether a pulse has been detected. If the controller has not detected a pulse, then the method proceeds back to block 304. If the controller does detect a pulse, then the method proceeds to block 308 in which the controller increments a pulse counter. At block, 310, the method 300 includes determining, by the counter, whether timeout has been detected. According to some embodiments, the controller 102 will detect a timeout when a predetermined number of clock cycles has passed without the controller 102 having detected a pulse from the signal output by the AND gate A2. For example, in some embodiments, if there has been no pulse detected for one or two clock periods than the controller 102 may determine that a timeout has occurred and proceed to block 314. The controller 102 will not detect a timeout for as long as it is continuously (i.e., in each successive clock cycle) receiving pulses. Each time (e.g., for each clock cycle) controller 102 detects a pulse, the method proceeds back to block 308 in which the controller 102 increments the pulse counter. Thus, during a continuous (i.e., one per clock cycle) burst of pulses, the controller will repeatedly increment the pulse counter upon receiving each new pulse of the burst. Once the burst of pulses is finished, the controller 102 will determine that a timeout has occurred as described above and the method will proceed to block 314 where the controller exits the counter routine, stores the counted value in a register and computes an equivalent analog value based on the stored count. Thus, for each burst of pulses, the controller will count the number of pulses in the burst, store the value and determine an equivalent analog value corresponding to the burst of pulses. It will be understood that some bursts may only contain a single pulse, which corresponds to the least count of the digital value.

According to some embodiments, the controller 102 may reconstruct the magnitude of the voltage of a sensed analog signal for an interval by multiplying the observed pulse count of the interval by the resolution. The resolution may be considered to be the smallest possible input voltage that will result in an increment on the pulse count described below and is thus represented in units of voltage per count (e.g., mV/count). Resolution can be calculated by dividing the maximum measurable input voltage by the maximum pulse count. The maximum measurable voltage is the input voltage for which the pulse count is maximum. This highest pulse count is produced when the input voltage is equal to the peak to peak voltage of the triangular wave (i.e., Vpp of the triangular wave). The maximum possible pulse count is the ratio of clock frequency to the triangular wave frequency. Thus, the resolution can be calculated as being equal to (Vpp of triangular wave)/(Fclk/Ftriangularwave) which is equivalent to (Vpp of triangular wave * Ftriangularwave)/Fclk. Thus, the controller 102 can reconstruct the magnitude of analog voltage for an interval by multiplying the observed pulse count during the interval by the resolution. It will be understood that the magnitude of current can alternatively be measured/determined in a manner similar to that described herein with respect to voltage.

Figure 4:
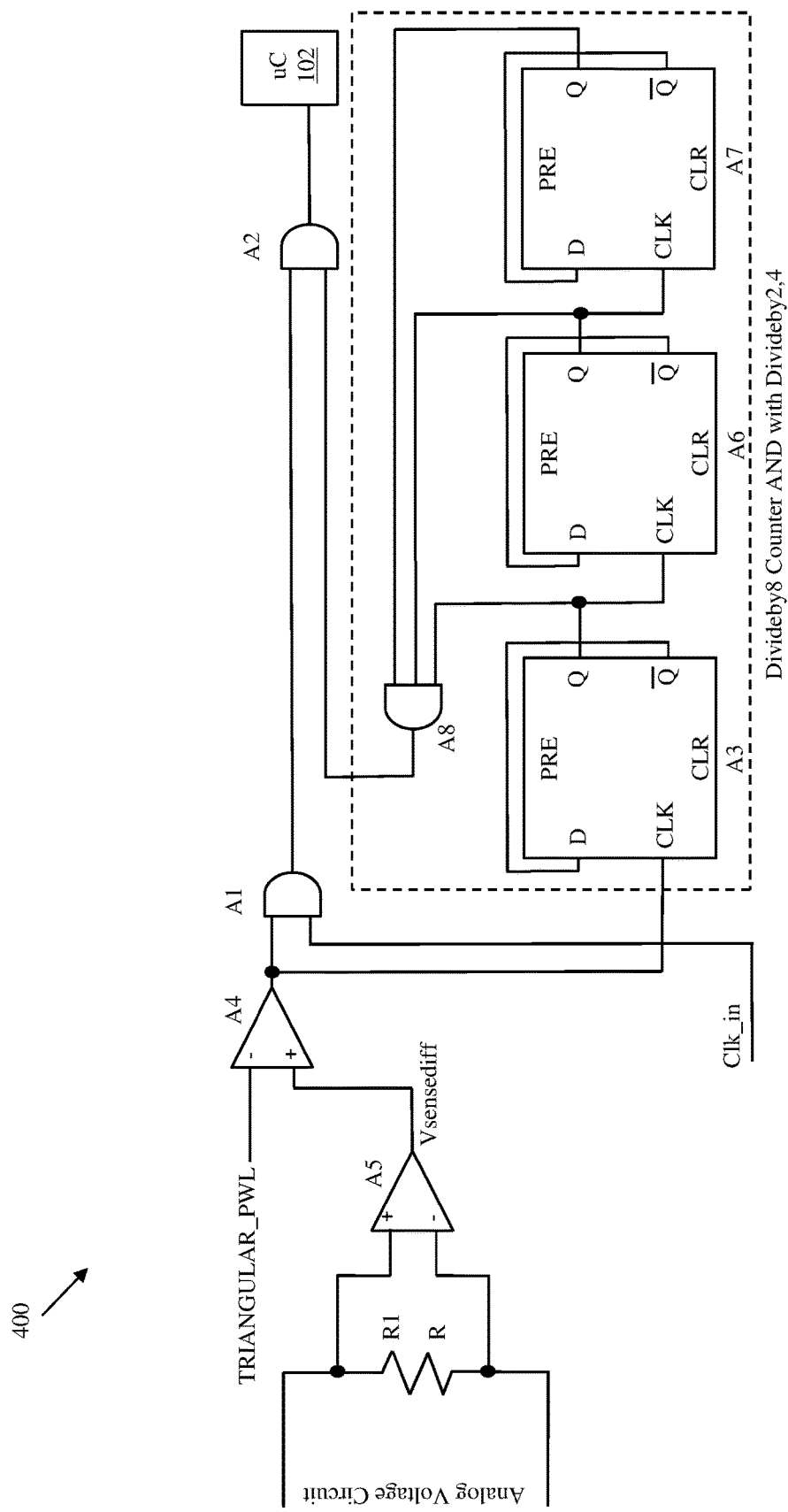
FIG. 4 depicts another block diagram of a circuit topology for sensing an analog signal through digital I/O pins of a controller according to one or more embodiments.
Figure 5:
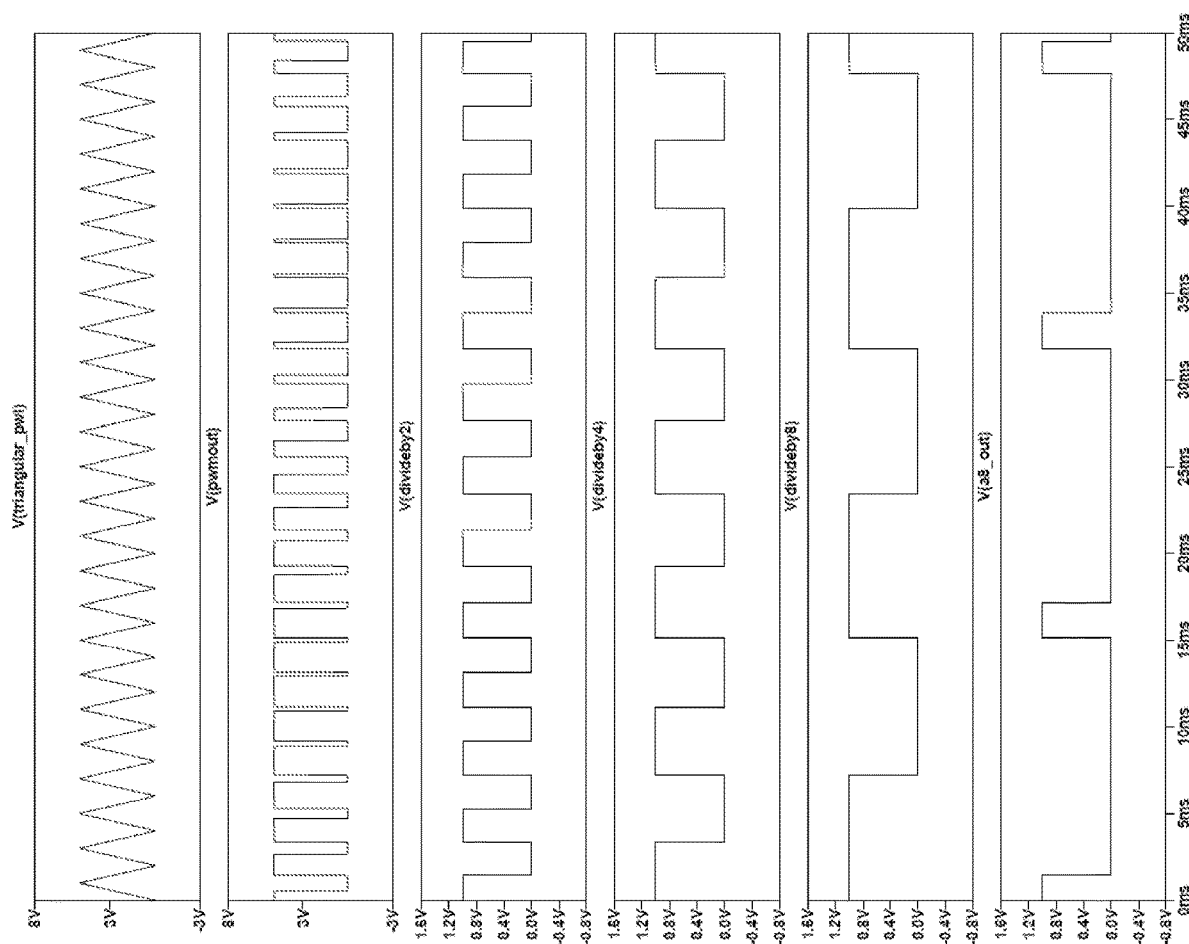
FIG. 5 depicts an example timing diagram for a circuit topology for sensing an analog signal through digital I/O pins of a controller that includes a divideby4,8 counter with an AND gate according to one or more embodiments.

As described above, the divideby2 counter A3 of FIGS. 1A and 1B is configured to allow the software routine of the controller 102 distinguish between intervals of sampled data. FIG. 4 shows an alternative embodiment of a block diagram of a circuit topology 400 for sensing an analog signal through digital input/output (I/O) pins of a controller that operates in a manner similar to that described above with respect to FIG. 1A, but instead of a divideby2 counter A3, this embodiment includes a divideby8 counter A7, divideby4 counter A6 and a divideby2 counter A3 having outputs that are AND'd together by AND gate A8 that can be used to provide an interleaved signal to the controller input. Use of a divideby2 counter (and other counter configurations such as that shown in FIG. 4) interleaves the sample to create distinct bursts of pulses. Otherwise, when a sample output reaches its full-scale value (i.e., maximum voltage reading), the controller may not be able to distinguish between that sample and the next sample, which would otherwise appear immediately after the first sample without a gap (i.e., there may be no gap between bursts of pulses that would allow the controller to distinguish between the bursts). As shown by FIG. 5, the AND gate A8 will mask the logic HIGH window of the Divideby4 counter A6 and the Divideby8 counter A7 with respect to the divideby2 counter A3 output Q. The AND gate A2 will stay at logic LOW for seven consecutive cycles of triangular wave duration.

Figure 6:
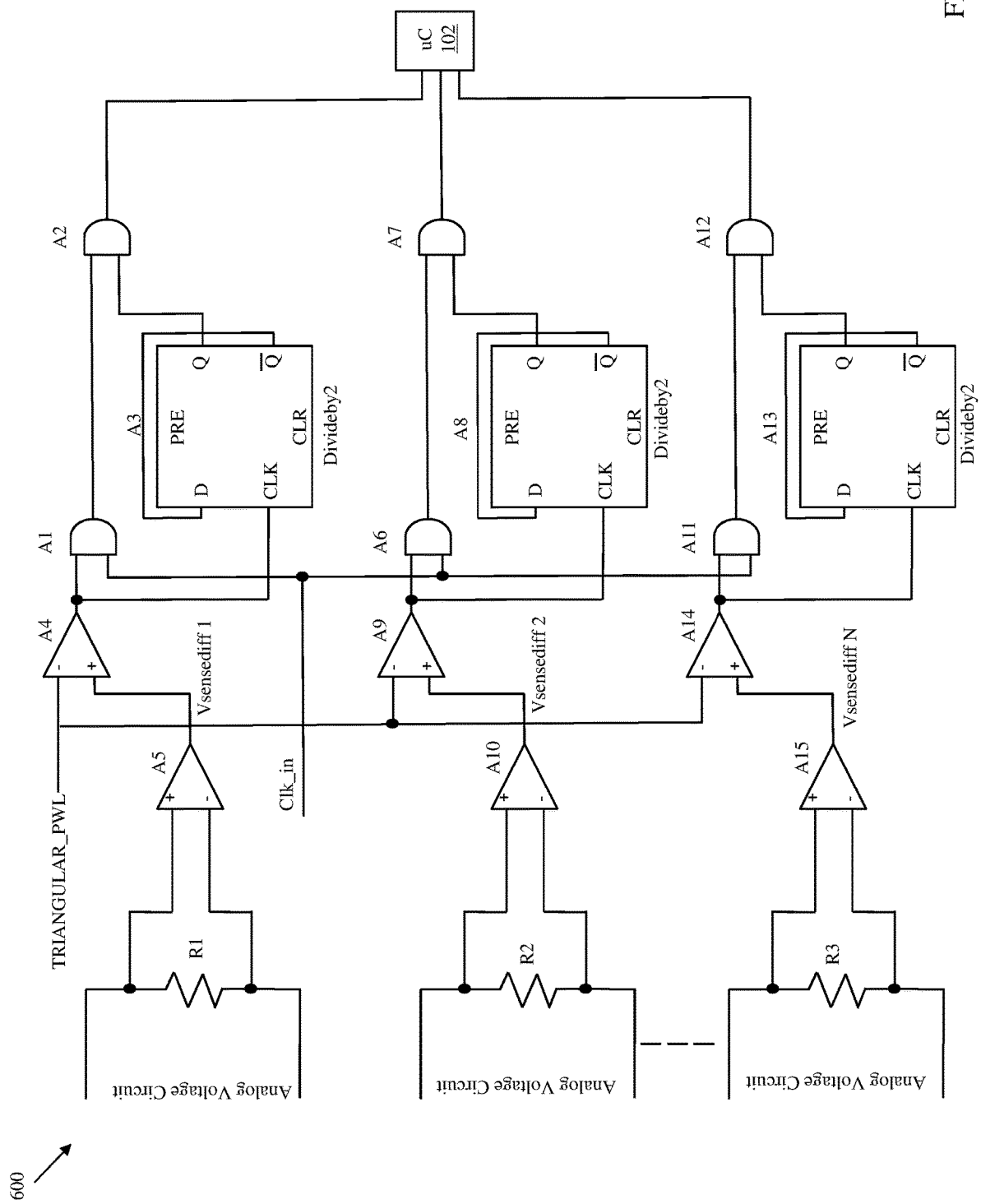
FIG. 6 depicts another block diagram of a circuit topology for sensing an analog signal through digital input/output (I/O) pins of a controller according to one or more embodiments.

FIG. 6 shows an alternative embodiment of a block diagram of a circuit topology 600 for sensing an analog signal through digital input/output (I/O) pins of a controller that operates in a manner similar to that described above with respect to FIG. 1A, but shows that in some embodiments, multiple of the circuits shown in FIG. 1A can be implemented together in order to obtain multiple analog readings and generate multiple input signals to different pins of the controller 102. For example, resistors R2 and R3 perform a function similar to resistor R1, difference amplifiers A10 and A15 perform a similar function to difference amplifier A5, comparators A9 and A14 perform a similar function to difference amplifier A4, divideby2 counters A8 and A13 perform a similar function to divideby2 counter A3, first AND gates A6 and A11 perform a similar function to first AND gate A1 and second AND gates A7 and A12 perform a similar function to second AND gate A2. According to some embodiments, the outputs of second AND gates A2, A7 and A12 may each be connected to a separate pin of controller 102 such that the controller 102 may receive a digital signal from each ADC circuit. Although three ADC circuits are depicted in FIG. 6, it will be appreciated that in some embodiments, the circuit design may include up to as many ADC circuits as there are pins on the controller 102 for receiving the corresponding digital signals output by the respective ADC circuits. Although not shown, a circuit topology similar to circuit topology 600 can be formed by combining multiple of the circuits shown in FIG. 1B together in a similar manner. The configuration shown in FIG. 6 can be used to sample multiple signals simultaneously using a single Clk_in and TRIANGULAR_PWL source.

Figure 7:
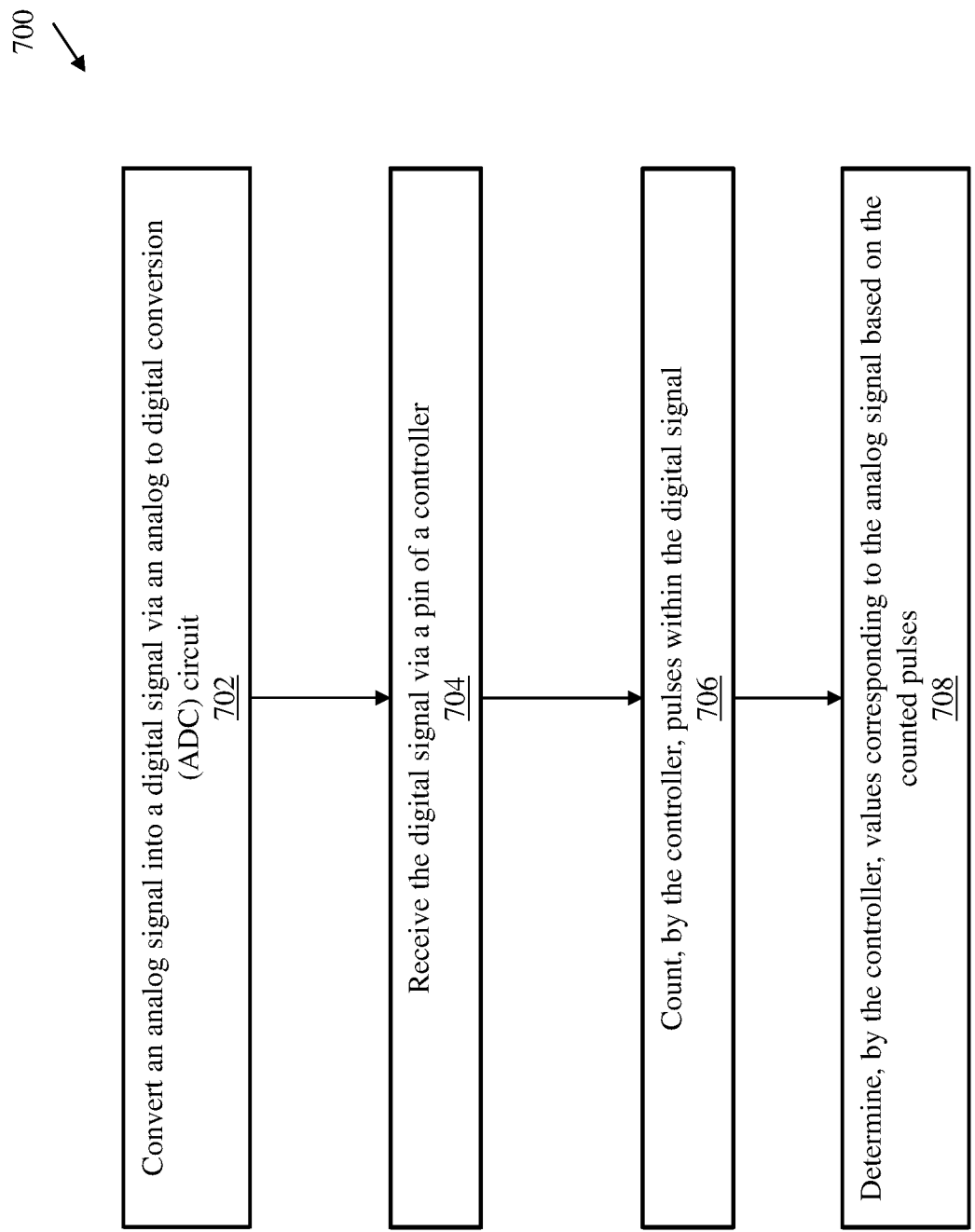
FIG. 7 depicts flow diagram of a method for sensing an analog signal through a digital I/O pin according to one or more embodiments.

FIG. 7 depicts a flow diagram of a method for sensing an analog signal through digital input/output (I/O) pins according to one or more embodiments. The method 700 includes converting, via an analog digital conversion circuit (e.g., such as one of the circuits depicted in FIG. 1, 4 or 6) the analog signal into a digital signal, as shown in block 702. At block 204, the method 700 includes receiving the digital signal via a pin of a controller (e.g., controller 102). The method 700, at block 706, includes counting, by the controller, pulses within the digital signal for example, in accordance with the method described above with respect to FIG. 3. And at block 708, the method 700 includes determining, by the controller, values corresponding to the analog signal based on the counted pulses for example, in a manner similar to that described previously above.

Additional processes may also be included. It should be understood that the processes depicted in FIGS. 3 and 7 represent illustrations and that other processes may be added or existing processes may be removed, modified, or rearranged without departing from the scope and spirit of the present disclosure.

The term "about" is intended to include the degree of error associated with measurement of the particular quantity based upon the equipment available at the time of filing the application. For example, "about" can include a range of ±8% or 5%, or 2% of a given value.

The terminology used herein is for the purpose of describing particular embodiments only and is not intended to be limiting of the present disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, element components, and/or groups thereof While the present disclosure has been described with reference to an exemplary embodiment or embodiments, it will be understood by those skilled in the art that various changes may be made and equivalents may be substituted for elements thereof without departing from the scope of the present disclosure. In addition, many modifications may be made to adapt a particular situation or material to the teachings of the present disclosure without departing from the essential scope thereof. Therefore, it is intended that the present disclosure not be limited to the particular embodiment disclosed as the best mode contemplated for carrying out this present disclosure, but that the present disclosure will include all embodiments falling within the scope of the claims.

What is claimed is:

1. A system for sensing an analog signal through digital input/output (I/O) pins, the system comprising:
an analog to digital conversion (ADC) circuit configured to generate a digital signal based on observations of the analog signal obtained from an analog circuit, the ADC circuit comprising:
a difference amplifier;
a comparator;
a divideby2 counter;
a first AND gate; and
a second AND gate; and
a controller comprising a pin configured to receive the digital signal, the controller being further configured to:
count pulses within the digital signal; and
determine, based on the counted pulses, values corresponding to the analog signal.

2. The system of claim 1, wherein each of two inputs to the difference amplifier are connected to the analog circuit on either side of a resistor.

3. The system of claim 2, wherein the difference amplifier outputs a difference signal based on the two inputs connected to the analog circuit.

4. The system of claim 3, wherein a non-inverting input of the comparator is connected to an output of the difference amplifier such that the comparator receives the difference signal via the non-inverting input and an inverting input of the comparator receives a triangular wave signal.

5. The system of claim 4, wherein the comparator outputs a pulse width modulation (PWM) signal.

6. The system of claim 5, wherein the first AND gate receives the PWM signal and a high frequency clock signal as inputs.

7. The system of claim 6, wherein the divideby2 counter receives the PWM signal as a clock input signal and the divideby2 counter outputs a square wave signal.

8. The system of claim 7, wherein the second AND gate receives an output of the first AND gate and the square wave signal as inputs.

9. The system of claim 8, wherein the digital signal comprises an output signal of the second AND gate.

10. The system of claim 1, wherein counting pulses within the digital signal comprises counting, for one or more intervals, a number of pulses within each respective interval.

11. The system of claim 10, wherein determining values corresponding to the analog signal comprises for each of the one or more intervals, multiplying the respective count of pulses by a resolution.

12. The system of claim 11, wherein the resolution is determined by multiplying a peak to peak voltage of the triangular wave signal by a frequency of the triangular wave signal and dividing by a frequency of the high frequency clock signal.

13. A method for sensing an analog signal through digital input/output (I/O) pins, the method comprising:
converting, via an analog to digital conversion (ADC) circuit, the analog signal into a digital signal;
receiving, via a pin of a controller, the digital signal;
counting, by the controller, pulses within the digital signal; and
determining, by the controller, values corresponding to the analog signal based on the counted pulses.

14. The method of claim 13, wherein counting pulses within the digital signal comprises counting, for one or more intervals, a number of pulses within each respective interval.

15. The method of claim 14, wherein determining values corresponding to the analog signal comprises for each of the one or more intervals, multiplying the respective count of pulses by a resolution.

16. The method of claim 15, wherein the resolution is determined by multiplying a peak to peak voltage of the triangular wave signal by a frequency of a triangular wave signal and dividing by a frequency of a high frequency clock signal.

17. The method of claim 16, wherein converting the analog signal to a digital signal via the ADC circuit comprises generating, by a difference amplifier having two inputs connected to an analog circuit, a difference signal.

18. The method of claim 17, wherein converting the analog signal to a digital signal via the ADC circuit further comprises generating, by a comparator receiving the triangular wave signal and the difference signal as inputs, a pulse width modulation (PWM) signal.

19. The method of claim 18, wherein converting the analog signal to a digital signal via the ADC circuit further comprises:
receiving, by a first AND gate, the PWM signal to a high frequency clock signal; and
generating, by the first AND gate, an output signal based on a comparison of the PWM signal to a high frequency clock signal.

20. The method of claim 19, converting the analog signal to a digital signal via the ADC circuit further comprises:
receiving, by a second AND gate, the first output signal and a square wave signal generated by a divideby2 counter; and
generating, by the second AND gate, the digital signal based on a comparison of the output signal and the square wave signal.

* * * * *